(12) United States Patent
Murakami

(10) Patent No.: US 6,198,129 B1
(45) Date of Patent: Mar. 6, 2001

(54) VERTICAL TYPE INSULATED GATE TRANSISTOR

(75) Inventor: Norio Murakami, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/433,869

(22) Filed: Nov. 4, 1999

(30) Foreign Application Priority Data

Aug. 31, 1999 (JP) .................................................... 11-245617

(51) Int. Cl.$^7$ ............................ H01L 29/76; H01L 29/94; H01L 31/062; H01L 31/113; H01L 31/119
(52) U.S. Cl. ............................................ 257/339; 257/342
(58) Field of Search ..................................... 257/335, 336, 257/337, 339, 342

(56) References Cited

U.S. PATENT DOCUMENTS

| | | | |
|---|---|---|---|
| 4,794,432 | * | 12/1988 | Yilmaz et al. . |
| 5,053,838 | * | 10/1991 | Fujihira . |
| 5,621,234 | | 4/1997 | Kato . |
| 5,712,501 | * | 1/1998 | Davies et al. ........................ 257/335 |
| 5,939,752 | * | 8/1999 | Williams ............................... 257/339 |
| 6,072,216 | * | 6/2000 | Williams et al. ..................... 257/339 |

FOREIGN PATENT DOCUMENTS

| | | |
|---|---|---|
| 60-5568 | 1/1985 | (JP) . |
| 63-150970 | 6/1988 | (JP) . |
| 7-78982 | 3/1995 | (JP) . |

* cited by examiner

Primary Examiner—Ngân V. Ngô
(74) Attorney, Agent, or Firm—Jones Volentine, L.L.C.

(57) ABSTRACT

At a portion below a gate electrode of a vertical type MOS transistor having a gate electrode and source electrodes formed over the surface of a semiconductor substrate and a drain electrode formed over the back thereof, a P type impurity diffusion layer spaced away from P well diffusion layers which surround sources, is formed in the semiconductor substrate which serves as a drain region.

14 Claims, 3 Drawing Sheets

VERTICAL TYPE INSULATED GATE TRANSISTOR

BACKGROUND OF THE INVENTION

1. Field of the Invention

This invention relates to a structure of a power MOS transistor suitable for use in a motor control circuit or a power circuit or the like and a method of manufacturing the same.

2. Description of the Related Art

Various structures have heretofore been proposed as the structure of a power MOS transistor. However, the structure of a VDMOS (Vertical Diffusion MOS) transistor corresponding to a vertical type MOS transistor, featuring that it causes current to flow in the vertical direction of a semiconductor substrate, is generally basic to the structure of the power MOS transistor. This is because since the entire substrate is formed as a drain structure, the resistance thereof becomes low and a large current flow is provided and it is apt to withstand high voltages and reduce thermal resistance.

FIG. 1 is a cross-sectional view of a conventional VDMOS transistor and shows an N channel type. A drain region of the VDMOS transistor is formed of an N type semiconductor substrate 1, whereas each source region thereof is composed of an N+ diffusion layer 6, a P well layer 2 and a P+ diffusion layer 7 for applying a voltage.

The operation of the VDMOS transistor is as follows: When a desired voltage is applied to a gate electrode 5, a current flows from the N type semiconductor substrate 1 used as the drain to the N+ diffusion layer 6 used as the source through the surface of a semiconductor disposed below the gate electrode 5. The amount of the current at this time is controlled by gate and drain voltages in a manner similar to the normal type MOS transistor.

With the spread of application areas of a VDMOS transistor, there has recently been a demand for a VDMOS transistor made more powerful in performance. A reduction in on resistance, which is the utmost important characteristic of the power MOS transistor, is required to meet such a demand. The on resistance of the VDMOS transistor consists of a series of a channel resistance of a MOS transistor and a resistance (lying in the vertical direction) of an N type semiconductor substrate. However, the shorter the length of a gate of the transistor, the more the channel resistance can be reduced. It is thus quite natural that a reduction in on resistance should be achieved by shortening the gate length and reducing the resistance of the substrate.

As is however apparent from FIG. 1, the gate length of the VDMOS transistor is determined according to a junction depth of each P well diffusion layer 2 formed over the M type semiconductor substrate 1. Since the P well diffusion layers 2 are respectively formed from gate ends on the source sides of the VDMOS transistor, a channel region is determined depending on the length of each P well diffusion layer 2, which extend in the transverse direction thereof. It is thus necessary to form the P well diffusion layers 2 shallowly for the purpose of a reduction in gate length.

On the other hand, a high withstand voltage characteristic is known as one feature of the VDMOS transistor. While a withstand voltage of about 1000V is required according to purposes, a withstand voltage of about a few 100V is required even in the normal case. The P well diffusion layers 2 are formed deep for the purpose of high withstanding and the shape of each P well diffusion layer 2 by which the withstand voltage is determined, is set as smooth as possible, thereby reducing the curvature thereof and avoiding the concentration of an electric field on each P well diffusion layer 2. It is necessary to select a substrate having a high resistance or resistivity of about 100 Ω·cm for the purpose of high withstanding from the viewpoint of a depletion layer even in the case of the substrate resistance.

SUMMARY OF THE INVENTION

As described above, it becomes necessary to deepen the P well diffusion layers and increase the resistance of the N type semiconductor substrate with a view toward maintaining a high withstand voltage characteristic. However, a problem arises in that this is contrary to the reduction in on resistance.

In order to solve the problem of a difficulty in reducing the on resistance, the present invention provides a vertical type insulated gate transistor wherein a P type impurity region for relaxing or reducing an electric field is formed between the N type semiconductor substrate and the corners of the P well diffusion layers both employed in the conventional VDMOS transistor.

According to the present invention, since an electric field produced between a drain and P well diffusion layers is reduced owing to a P type impurity diffusion layer (field relaxation layer) provided in the neighborhood of the corners of the P well diffusion layers, a transistor can withstand high voltages. Thus, since the P well diffusion layers can be shallowed in depth, the VDMOS transistor can be reduced in gate length. Further, since the depth of each P well diffusion layer and the expansion of a depletion layer therefrom, which are parameters for determining the thickness of the semiconductor substrate, are also reduced owing to a shallow junction between the P well diffusion layers and the semiconductor substrate, the thickness of the substrate can be formed thinner. It is therefore possible to reduce on resistance while a high withstand voltage characteristic is being held.

Typical ones of various inventions of the present application have been shown in brief. However, the various inventions of the present application and specific configurations of these inventions will be understood from the following description.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE INVENTION

Preferred embodiments of the present invention will hereinafter be described with reference to the accompanying drawings.

Figure 1:
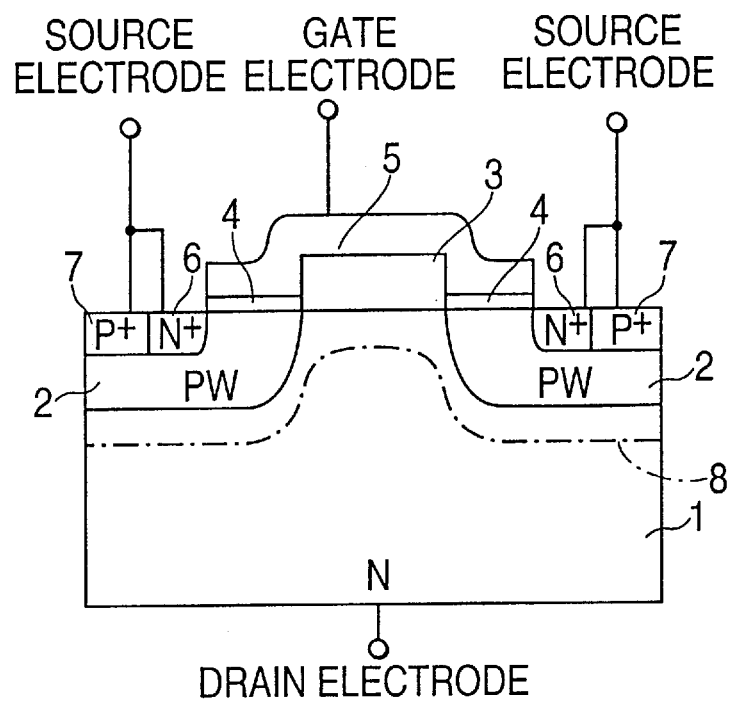
FIG. 1 is a cross-sectional view of VDMOS transistor according to a prior art.
Figure 2:
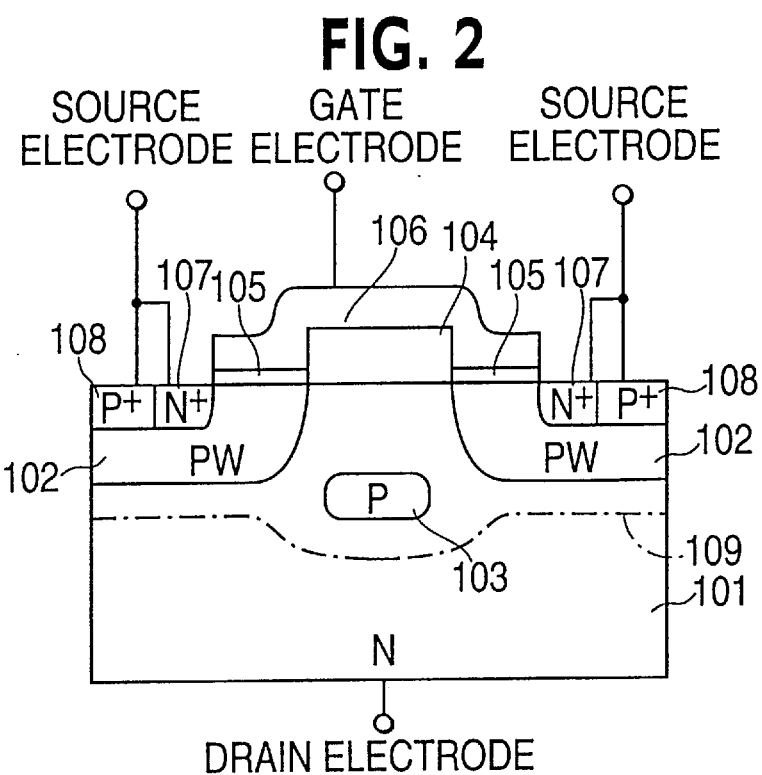
FIG. 2 is a cross-sectional view of a VDMOS transistor according to the present invention.

FIG. 2 is a cross-sectional view for describing a structure (unit cell) of an N channel VDMOS transistor according to the present invention. A pair of P well diffusion layers 102 is formed over an N type semiconductor substrate 10 having about 10 Ω·cm to 100 Ω·cm. The density or concentration of the P well diffusion layer is 1E16cm-3 and the depth thereof is about 2 μm. This structure results in a unit cell of the VDMOS transistor. The N type semiconductor substrate 101 is used as a drain region. As shown in FIG. 2, a P type impurity layer 103 used as an electric field relaxation layer is formed in the vicinity of the corners of the P well diffusion layers, i.e., in the N type semiconductor substrate 101 interposed between the pair of P well diffusion layers 102.

The P type impurity layer 103 is formed a few μm away from the P well diffusion layers 102 without making contact therewith. The concentration thereof is normally optimized to a range of 1E16cm-3 to 1E18cm-3 so as to reduce an electric field between the P well diffusion layers 102 and the N type semiconductor substrate (drain) 101. Further, the depth thereof is optimally set in consideration of the depth of each P well diffusion layer 102.

Figure 3:
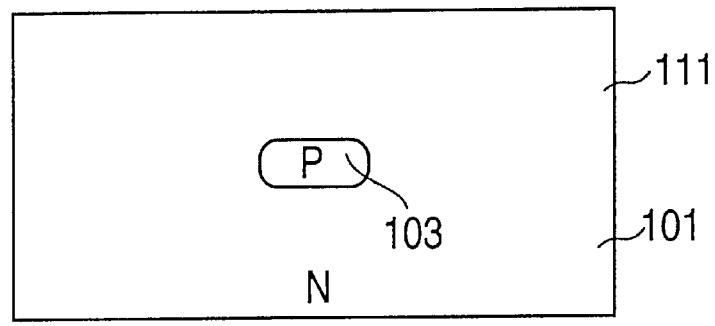
FIGS. 3 and 3A are alternative process views showing a method of manufacturing a VDMOS transistor according to the present invention.
Figure 3A:
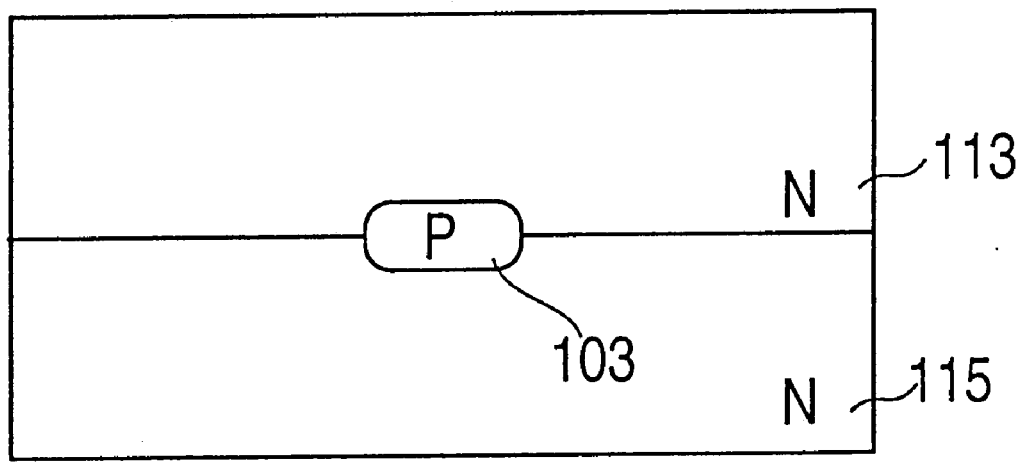

Reference numeral 104 indicates a field oxide film having a depth of about 1 μm, for separating between devices. The thickness of the field oxide film is set according to used voltages. Further, a gate oxide film 105 and a gate electrode 106 are formed as portions equivalent to expanding regions of the P well diffusion layers 102 and disposed over the surface of the semiconductor substrate. Furthermore, reference numerals 107 respectively indicate N+ diffusion layers which serve as source regions formed over the surfaces of the P well diffusion layers 102. Reference numerals 108 indicate P+ diffusion layers for making electrodes of the P well diffusion layers respectively. 'A method of manufacturing a VDMOS transistor according to the present invention will next be described with reference to FIGS. 3 through 5. Referring to FIG. 3, an N type semiconductor substrate 101 is first prepared. Alternatively, an N on N+ type semiconductor substrate may be used wherein a low-density impurity semiconductor is formed over a high-density impurity semiconductor. In this case, an N layer may be formed by an epitaxial method. A P type impurity layer 103, which serves as an electric field relaxation layer, is formed in the N type semiconductor substrate 101, as illustrated in FIG. 3. After patterning has been effected using the normal photolithography and etching technique, boron is introduced by an ion implantation method to form the P type impurity layer 103 in semiconductor substrate 101. The density thereof is 1E17cm-3 and the depth thereof is about 1 μm. Thereafter, an epitaxial layer 111 having resistance or resistivity which ranges from 10 Ω·cm to 100 Ω·cm and a thickness which ranges from 10 μm to 100 μm, is formed over the entire surface of the N type semiconductor substrate 101 by a CVD method, as also illustrated in FIG. 3. The resistance and thickness of the epitaxial layer, etc. are optimized according to the depth of each P well diffusion layer and the required withstand voltage value or the like. In an alternative embodiment as illustrated in FIG. 3A, the P type impurity layer 103 is formed in a boundary between N type impurity diffusion layer region 115 and N type epitaxial layer 113.

There is also known a method of directly introducing boron by a high-energy ion implantation method after the formation of an epitaxial layer. In this case, the process can be simplified because a diffusing process is omitted. This method does not necessarily require the epitaxial layer when it is used. The present structure can be also achieved by the normal N type silicon substrate alone.

Figure 4:
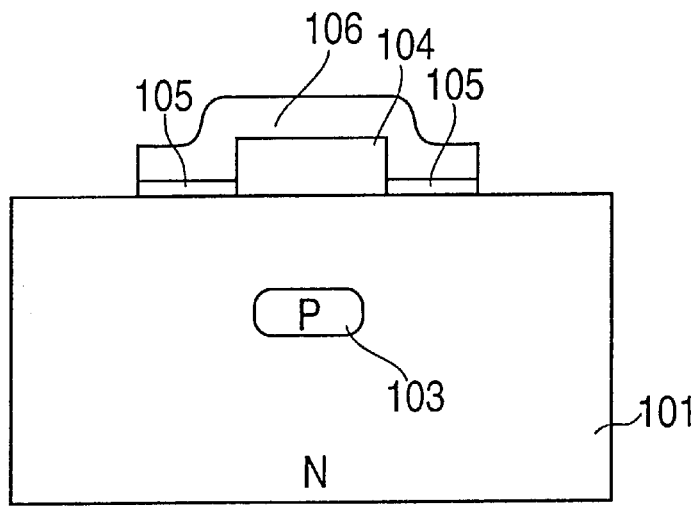
FIG. 4 is a process view illustrating the method of manufacturing the VDMOS transistor according to the present invention.

Next, a field oxide film 104 used as a thick silicon oxide film for preventing a parasitic channel and lowering the capacity of each gate is formed in a field region by a thermal oxidation process as shown in FIG. 4. Further, a gate oxide film 105 is formed in thicknesses ranging from about 100 Å to 1000 Å. Furthermore, a polysilicon film lowered in resistance, which serves as a gate electrode 106, is formed in thicknesses ranging from about 2000 Å to 5000 Å by the CVD method. A polycide film obtained by laminating a polysilicon film on a high-melting point metal film (W, Ti or the like) may be used as a gate structure.

Figure 5:
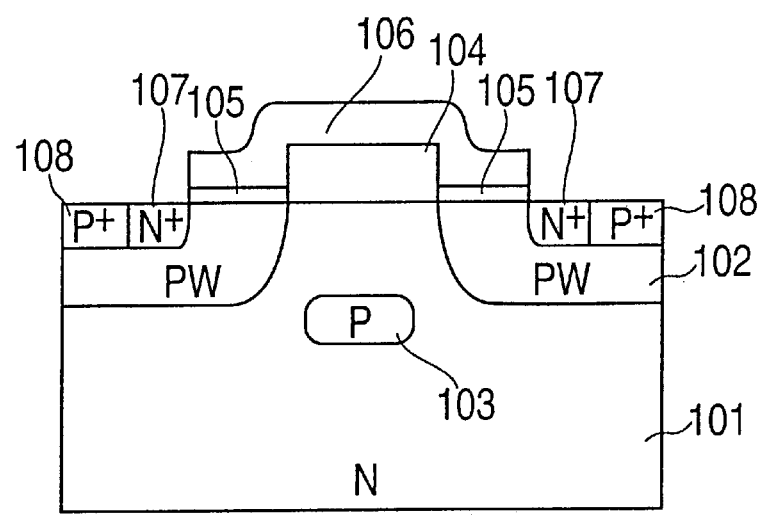
FIG. 5 is a process view depicting the method of manufacturing the VDMOS transistor according to the present invention.

Next, P well diffusion layers 102 are formed over the N type semiconductor substrate 101 by the ion implantation method or the like of boron with a gate pattern as a mask as shown in FIG. 5. A dose of about 1E13cm-2 is used and a desired depth is diffused within the substrate by thermal diffusion. While the P well diffusion layers 102 are expanded even in the transverse direction with the ends of the gate as start points at this time, diffusion conditions may preferably be set so that the width of each expansion and the length of the gate substantially coincide with each other. Thereafter, each of source regions 107 is formed to a density of 1E20cm-3 and a depth of about 0.5 μm by a phosphorus or arsenic ion implantation method.

Further, P+ diffusion layers 108, which serve as electrodes of the P well diffusion layers 102, are formed within the P well diffusion layers 102 so as to be formed to a density of 1E20cm-3 and a depth of about 0.5 μm.

As described above, the VDMOS transistor according to the present invention has the following advantages. Since a P type impurity diffusion layer is placed between P well diffusion layers and an N type semiconductor substrate and serves as a field relaxation structure, a high electric field produced from a drain can be relaxed and an available voltage restriction can be expanded.

Since the depth of each P well diffusion layer can be made shallow owing to such a field relaxation effect, the shortening of the width of aMOS channel layer and a reduction in the thickness of the substrate can be achieved simultaneously. Thus, the on-resistance, which is of an important characteristic of the VDMOS transistor, can be reduced and the device can be rendered high in performance.

While the present invention has been described with reference to the illustrative embodiments,this description is not intended to be construed in a limiting sense. Various modifications of the illustrative embodiments,as well as other embodiments of the invention,will be apparent to those skilled in the art on reference to this description. It is therefore contemplated that the appended claims will cover any such modifications or embodiments as fall within the true scope of the invention.

What is claimed is:

1. A vertical type insulated gate transistor, comprising:
   a first conduction type semiconductor substrate having a first conduction type drain region formed over a back thereof;
   a pair of first conduction type source regions formed over an upper surface of said semiconductor substrate;
   first impurity diffusion layer regions of a second conduction type which surround said source regions;
   a gate electrode formed over the upper surface of said semiconductor substrate between said pair of source regions; and
   a second conduction type impurity diffusion layer region formed so as to be disposed below said gate electrode and spaced away from said first impurity diffusion layer regions, and being within a depletion region extending from said first impurity diffusion layer regions when the vertical type insulated gate transistor is turned on.

2. The vertical type insulated gate transistor according to claim 1, wherein said second conduction type impurity diffusion layer region is a field relaxation layer.

3. The vertical type insulated gate transistor according to claim 1, wherein said semiconductor substrate is a substrate in which a low-density impurity semiconductor is formed over a high-density impurity semiconductor.

4. The vertical type insulated gate transistor according to claim 1, wherein said semiconductor substrate is a substrate in which an epitaxial layer is formed over a semiconductor layer.

5. The vertical type insulated gate transistor according to claim 4, wherein said second conduction type impurity diffusion layer region is formed in a boundary between said semiconductor layer and said epitaxial layer.

6. The vertical type insulated gate transistor according to claim 1, wherein said second conduction type impurity diffusion layer region is entirely within the depletion region when the vertical type insulated gate transistor is turned on.

7. The vertical type insulated gate transistor according to claim 1, wherein the depletion region also extends from said second conduction type impurity diffusion layer region.

8. A vertical type insulated gate transistor comprising:
a semiconductor substrate of a first conductivity type having a drain region in a lower portion thereof, with a drain electrode formed on a bottom surface thereof;
a pair of source regions of the first conductivity type formed in an upper surface of said semiconductor substrate;
diffusion layers of a second conductivity type that surround said source regions;
a gate electrode formed over the upper surface of said semiconductor substrate and between said source regions; and
a diffusion region of the second conductivity type formed as a relaxation layer in an upper region of said semiconductor substrate, below said gate electrode and spaced away from said diffusion regions.

9. The vertical type insulated gate transistor of claim 8, wherein said diffusion region is within a depletion region extending from said diffusion layers when the vertical type insulated gate transistor is turned on.

10. The vertical type insulated gate transistor of claim 9, wherein said diffusion region is entirely within the depletion region when the vertical type insulated gate transistor is turned on.

11. The vertical type insulated gate transistor of claim 9, wherein the depletion region also extends from said diffusion region.

12. The vertical type insulated gate transistor of claim 8, wherein said semiconductor substrate comprises a low-density impurity semiconductor formed over a high-density impurity semiconductor.

13. The vertical type insulated gate transistor of claim 8, wherein said semiconductor substrate comprises an epitaxial layer formed over a semiconductor layer.

14. The vertical type insulated gate transistor according to claim 8, wherein said diffusion region is formed in a boundary between the epitaxial layer and the semiconductor layer.

* * * * *